US012581963B2

(12) United States Patent
Zhang et al.

(10) Patent No.: US 12,581,963 B2
(45) Date of Patent: Mar. 17, 2026

(54) SMALL OUTLINE TVS PACKAGE COMPROMISING LEAD CLIP COIN STRUCTURE TO SUPPORT A SEMICONDUCTOR DEVICE

(71) Applicant: Littelfuse Semiconductor (Wuxi) Co., Ltd., Wuxi (CN)

(72) Inventors: Lucas Zhang, Wuxi (CN); Charlie Cai, Wuxi (CN); Jifeng Zhou, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 542 days.

(21) Appl. No.: 18/132,497

(22) Filed: Apr. 10, 2023

(65) Prior Publication Data
US 2023/0326837 A1    Oct. 12, 2023

(51) Int. Cl.
*H10W 70/40*      (2026.01)
*H10W 74/10*      (2026.01)

(52) U.S. Cl.
CPC ........ *H10W 70/427* (2026.01); *H10W 74/111* (2026.01)

(58) Field of Classification Search
CPC ................................................ H01L 23/49551
USPC ......................................................... 257/676
See application file for complete search history.

(56) References Cited

U.S. PATENT DOCUMENTS

| | | | |
|---|---|---|---|
| 2005/0224925 A1 | 10/2005 | Chou | |
| 2006/0255438 A1* | 11/2006 | Omori | H01L 23/49503 257/676 |
| 2014/0061884 A1* | 3/2014 | Carpenter | H01L 23/49524 257/676 |
| 2020/0357987 A1* | 11/2020 | Li | H01L 23/49548 |

FOREIGN PATENT DOCUMENTS

| | | |
|---|---|---|
| CN | 108109983 A | 6/2018 |
| CN | 111403366 A | 7/2020 |
| EP | 0794571 A1 | 9/1997 |
| JP | 2001237358 A | 8/2001 |
| WO | 03105225 A1 | 12/2003 |

OTHER PUBLICATIONS

European Search Report and Written Opinion for Application No. EP23167218, mailed Aug. 31, 2023, 9 pages.

* cited by examiner

*Primary Examiner* — Ajay Arora
(74) *Attorney, Agent, or Firm* — KDW Firm PLLC

(57) ABSTRACT

A discrete semiconductor package includes a semiconductor device, a left lead, and a right lead. The semiconductor device has a first side and a second side, the second side being opposite the first side. The left lead has a left terminal and a platform to support the semiconductor device on the first side. The right lead has a right terminal and a clip coin to support the semiconductor device on the second side.

19 Claims, 12 Drawing Sheets

SMALL OUTLINE TVS PACKAGE COMPROMISING LEAD CLIP COIN STRUCTURE TO SUPPORT A SEMICONDUCTOR DEVICE

CROSS REFERENCE TO RELATED APPLICATION

This application claims the benefit of priority to, Chinese Patent Application No. 2022208095103, filed Apr. 8, 2022, entitled "Discrete Power Semiconductor Package," which application is incorporated herein by reference in its entirety.

FIELD OF THE DISCLOSURE

Embodiments of the present disclosure relate to power semiconductors and, more particularly, to transient voltage suppressor devices.

BACKGROUND

The transient voltage suppressor (TVS) diode is a protection diode designed to protect electronic circuits against transients and overvoltage threats such as electrically fast transients (EFTs) and electro-static discharge (ESD). TVS diodes are silicon avalanche devices typically chosen for their fast response time (low clamping voltage), lower capacitance, and low leakage current. TVS diodes are available in both uni-directional (uni-polar) or bi-directional (bi-polar) diode circuit configurations. Each TVS diode has maximum ratings and thermal characteristics that govern the environment in which the TVS diode can be used.

TVS diodes are found in a variety of different packaging types, including power semiconductor discrete packaging, such as small outline dimension 123 flat type (SOD123FL), for example. One of the development directions for power semiconductor discrete packages is making them smaller and capable of supporting higher power. The SOD123FL uses discrete lead frame, chip, and clip in the package structure. But the package outline for the SOD123FL is too small, the solder process for the clip is difficult and faulty, and there are yield losses for the clip linker. Further, the overflow solder paste tends to contaminate the assembly machine guider, resulting in undesirable manufacturing downtime.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a discrete semiconductor package in accordance with the present disclosure may include a semiconductor device, a left lead, and a right lead. The semiconductor device has a first side and a second side, the second side being opposite the first side. The left lead has a left terminal and a platform to support the semiconductor device on the first side. The right lead has a right terminal and a clip coin to support the semiconductor device on the second side.

An exemplary embodiment of an integrated lead frame assembly for connecting to a semiconductor inside a discrete semiconductor package in accordance with the present disclosure may include a left lead and a right lead. The left lead has a left terminal and a platform to support the semiconductor device on one side. The right lead has a right terminal and a clip coin to support the semiconductor device on a second side opposite the one side.

BRIEF DESCRIPTION OF THE DRAWINGS

FIG. 1 is a diagram illustrating a discrete semiconductor package, in accordance with the prior art;

DETAILED DESCRIPTION

Figure 2:
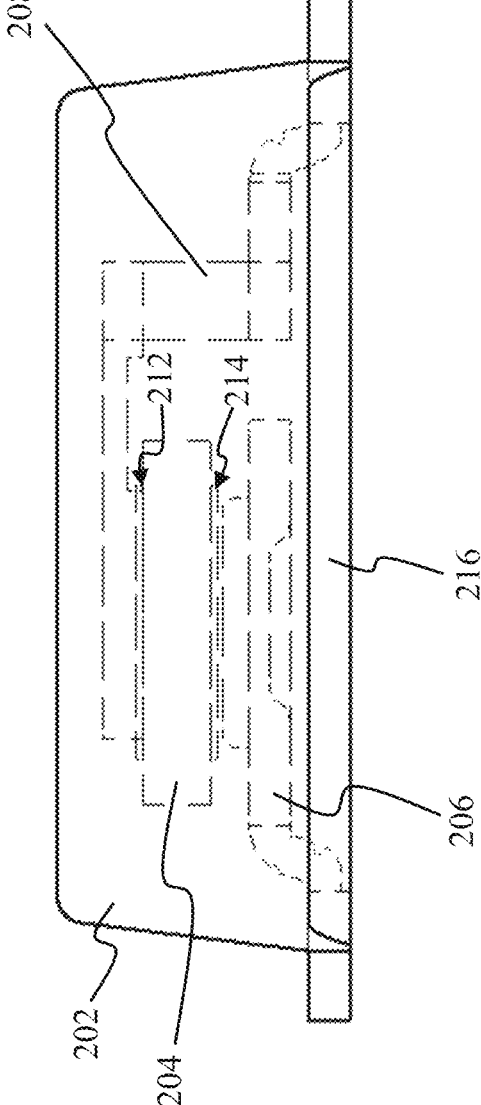
FIG. 2 is a diagram illustrating a discrete semiconductor package, in accordance with exemplary embodiments.

A discrete semiconductor package and an integrated lead frame assembly are disclosed. The discrete semiconductor package features a semiconductor device supported by the integrated lead frame assembly. The integrated lead frame assembly consists of two leads, a left lead for supporting the semiconductor device from below, and a right lead for supporting the semiconductor device from above. The left lead and the right lead are each formed as a single, unitary part. Both the left lead and the right lead feature bend arms and grooves for releasing/reducing bending stress during assembly. The right lead additionally features a bending shape to facilitate producing a force to support the semiconductor device, thus holding the device in place in the semiconductor package and protecting the device from moisture.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1:
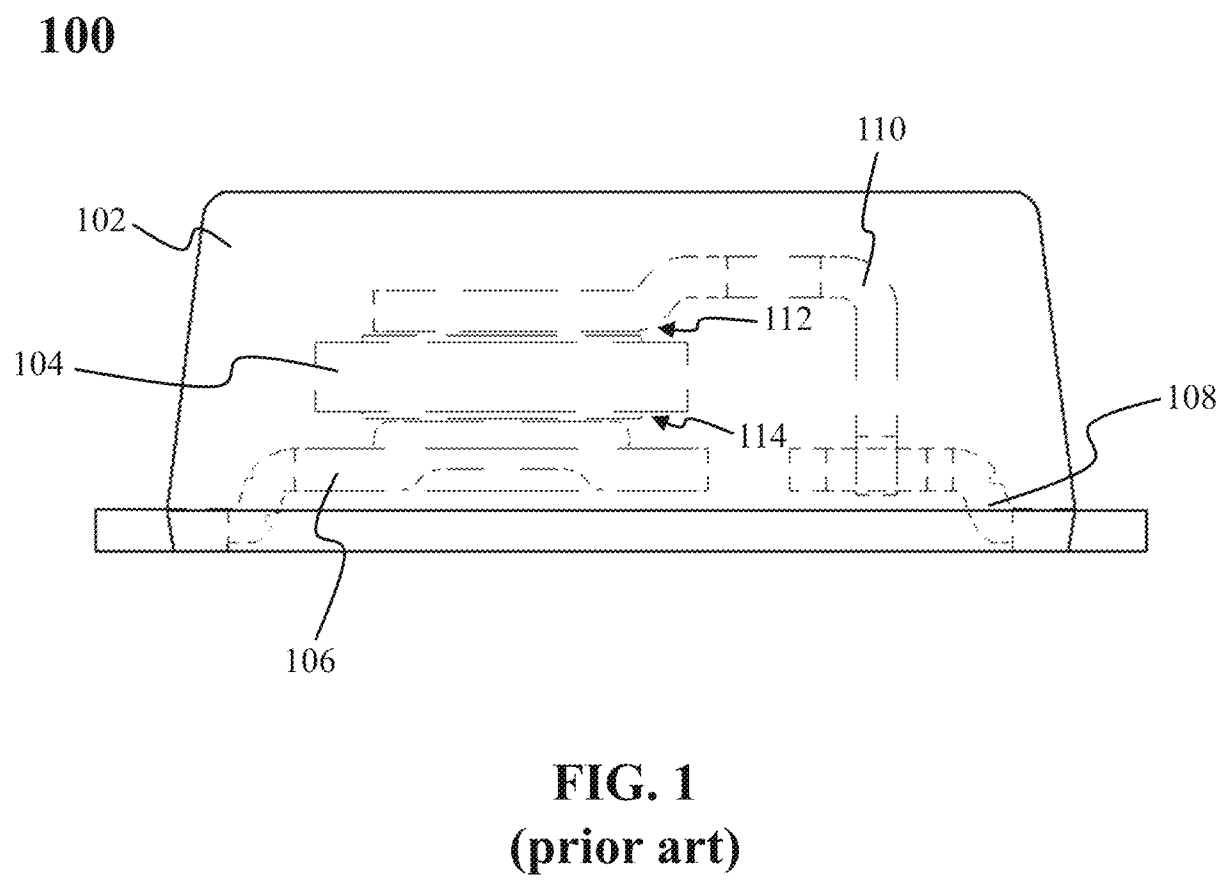

FIG. 1 is a representative drawing of a discrete semiconductor package 100, according to the prior art. A discrete semiconductor is a device specified to perform an elementary electronic function and is not divisible into separate components functional in themselves. Diodes, transistors, thyristors, and rectifiers are examples of discrete semiconductors. The discrete semiconductor package 100 features a transient voltage suppressor (TVS) diode chip 104 (hereinafter, "TVS chip 104"). The discrete semiconductor package 100 is an illustration of a prior art small outline dimension 123 flat type (SOD123FL).

A lead frame is a thin layer of metal that is utilized in semiconductor device assembly to connect the circuitry on circuit boards and electrical devices to the tiny electrical terminals etched on the surface of a semiconductor which, in this case, is the TVS chip 104. The TVS chip 104 is thus connected to a lead frame left lead 106, disposed below the TVS chip, and a clip 110, disposed above the TVS chip; the clip 110 is connected to a lead frame right lead 108 (hereinafter, "left lead 106" and "right lead 108"). The left lead 106 is connected to the TVS chip 104 using a solder paste 114; similarly, the clip 110 is connected to the TVS chip 104 using a solder paste 112. The internal structure of the discrete semiconductor package 100 is encapsulated in a compound 102, such as an epoxy composite.

Modifying a discrete semiconductor package, such as reducing its size, increasing its power capability, or both, can be challenging. As shown in FIG. 1, the discrete semiconductor device 100 uses the left lead 106, the right lead 108, the TVS chip 104, and the clip 110 in the package structure, encapsulated in the compound 102. Reducing the size of this package is challenging, as one or more of the component parts would be made smaller. The soldering process for the clip 110 is difficult and faulty at the smaller size and there are yield losses for the clip linker, the area in the front portion of the right lead 108 to which the clip 110 is soldered. Further, any overflow solder paste, whether between the TVS chip 104 and the left lead 106 or between the TVS chip and the clip 110, tends to contaminate the assembly machine guider during manufacture.

To increase the power of the discrete semiconductor device 100, the TVS chip 104 would likely be larger in size. As with reducing the size of component parts, increasing the size of the TVS chip 104 results in yield losses for the clip linker as well as undesirable overflow solder paste.

FIG. 2 is a representative drawing of a discrete semiconductor package 200, according to exemplary embodiments. The discrete semiconductor package 200 features a TVS diode chip 204 (hereinafter, "TVS chip 204"). The discrete semiconductor package 200 is an illustration of an SOD123FL semiconductor package having novel features to address the shortcomings of the discrete semiconductor package 100 of FIG. 1.

The TVS chip 204 is connected to a lead frame left lead 206, disposed below the TVS chip, and a lead frame right lead 208, disposed above the TVS chip (hereinafter, "left lead 206" and "right lead 208"). The left lead 206 is connected to the TVS chip 204 using a solder paste 214; similarly, the right lead 208 is connected to the TVS chip 204 using a solder paste 212. The left lead 206 and the right lead 208 are disposed on an epoxy molding compound (EMC) 216, which is disposed at the base of the discrete semiconductor package 200. As will be shown below, in exemplary embodiments, the clip is integrated into the right lead 208. The internal structure of the discrete semiconductor package 100 is encapsulated in a compound 202, such as an epoxy composite.

In exemplary embodiments, the discrete semiconductor package 200 differs from the prior art discrete semiconductor package 100 (FIG. 1) in ways that overcome the above-described obstacles to decreasing the size of the package and increasing its power capability. In exemplary embodiments, the right lead 208 is modified to include a clip function which is combined as a single, unitary component, the left lead 206 is redesigned to facilitate the seating of the TVS chip 204, both the left lead and the right lead including both bending and groove features to release the bending stress during assembly, and the clip function is redesigned to facilitate ease of manufacture as well as reduced failure rate during manufacture. Because the clip function is part of the right lead 208, there is less solder than with the prior art discrete semiconductor package 100.

Figure 3A:
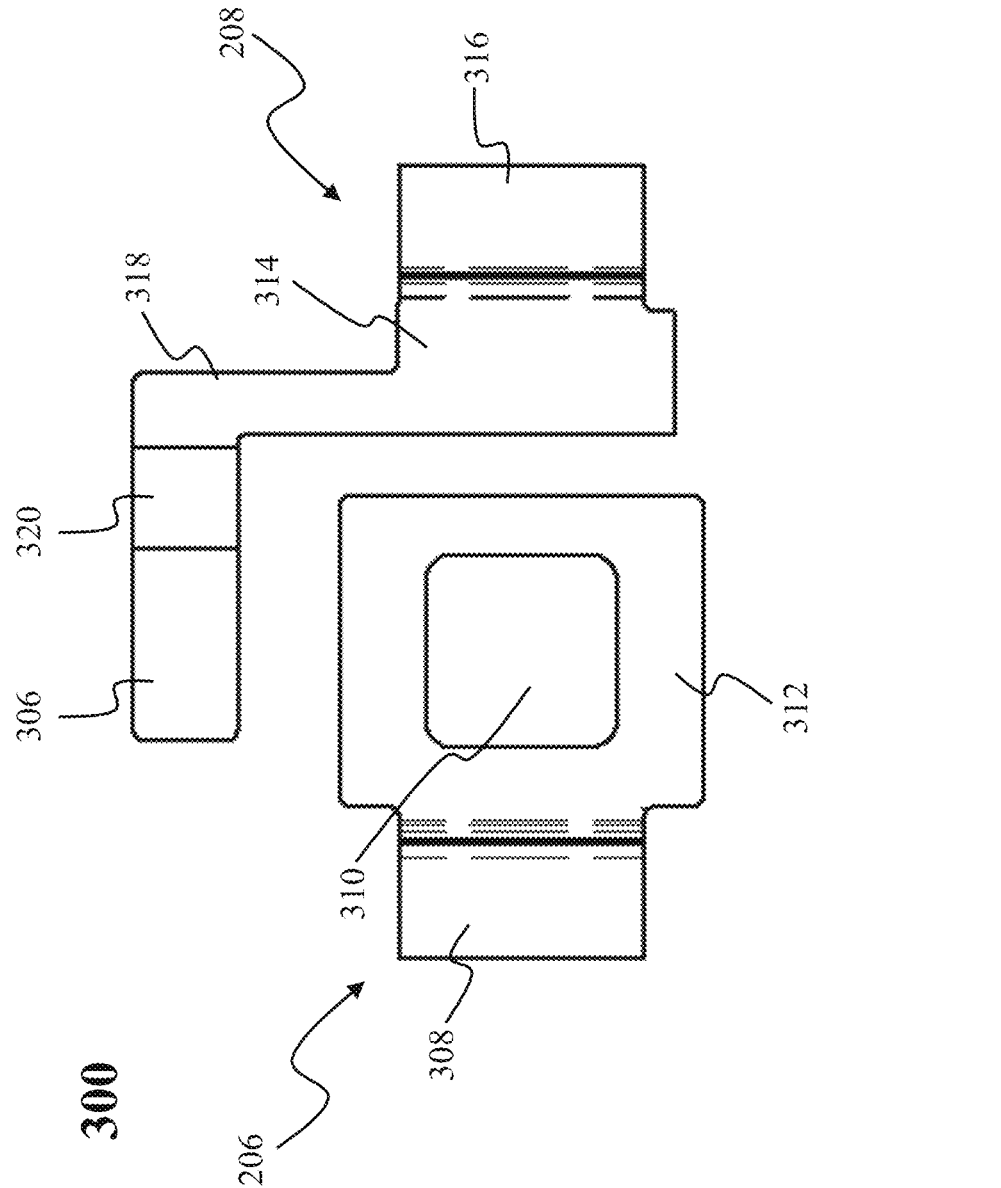
FIGS. 3A-3D are diagrams illustrating an integrated lead frame assembly of the discrete semiconductor package of FIG. 2, in accordance with exemplary embodiments.
Figure 3B:
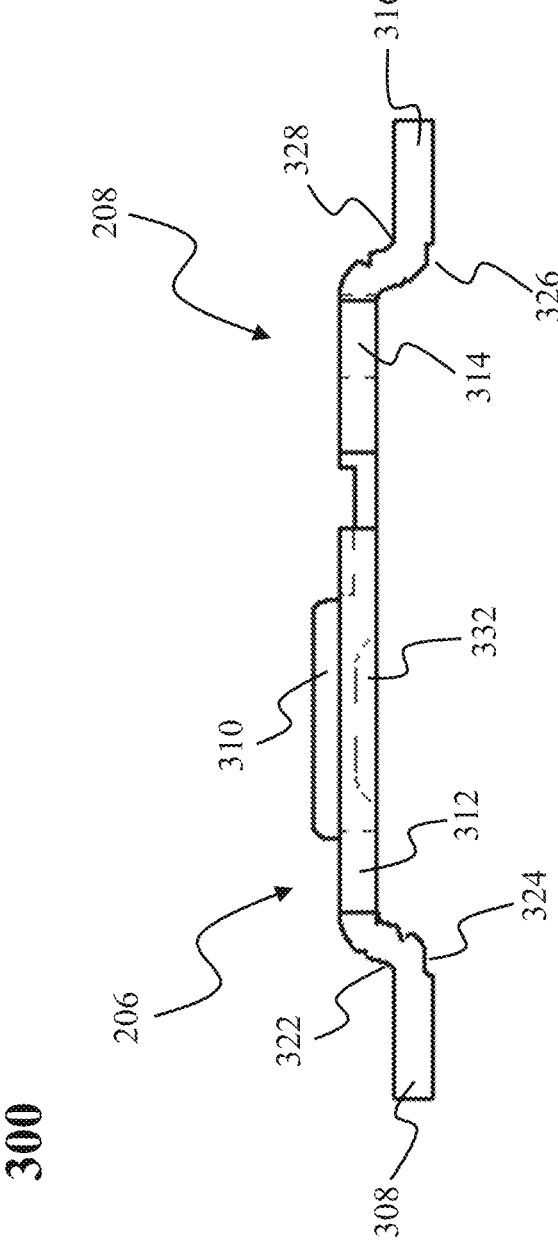
Figure 3C:
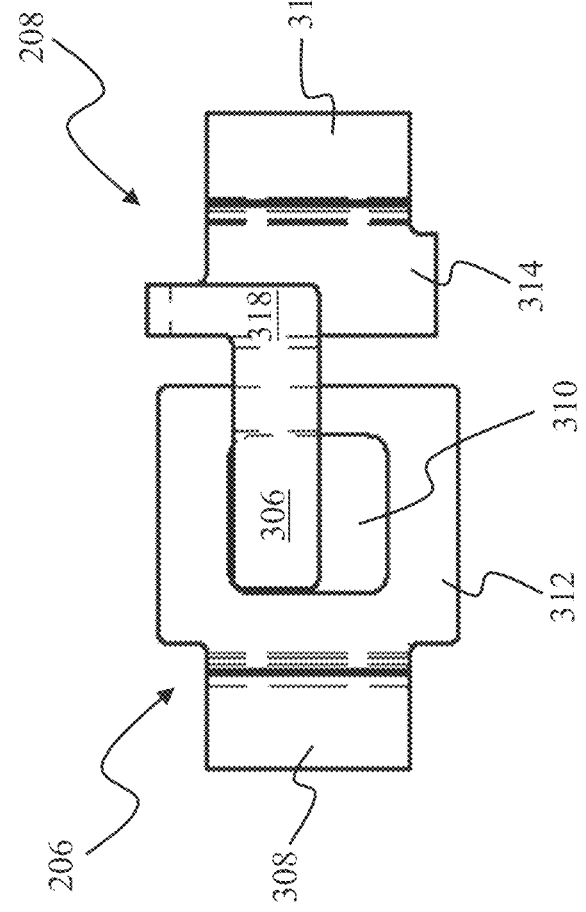
Figure 3D:
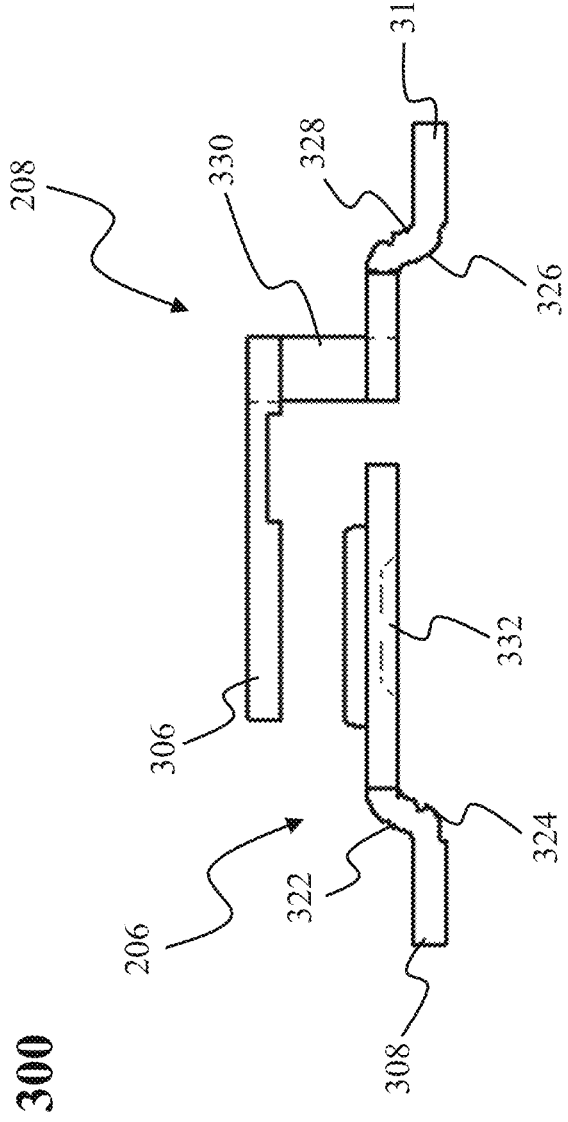
Figure 4A:
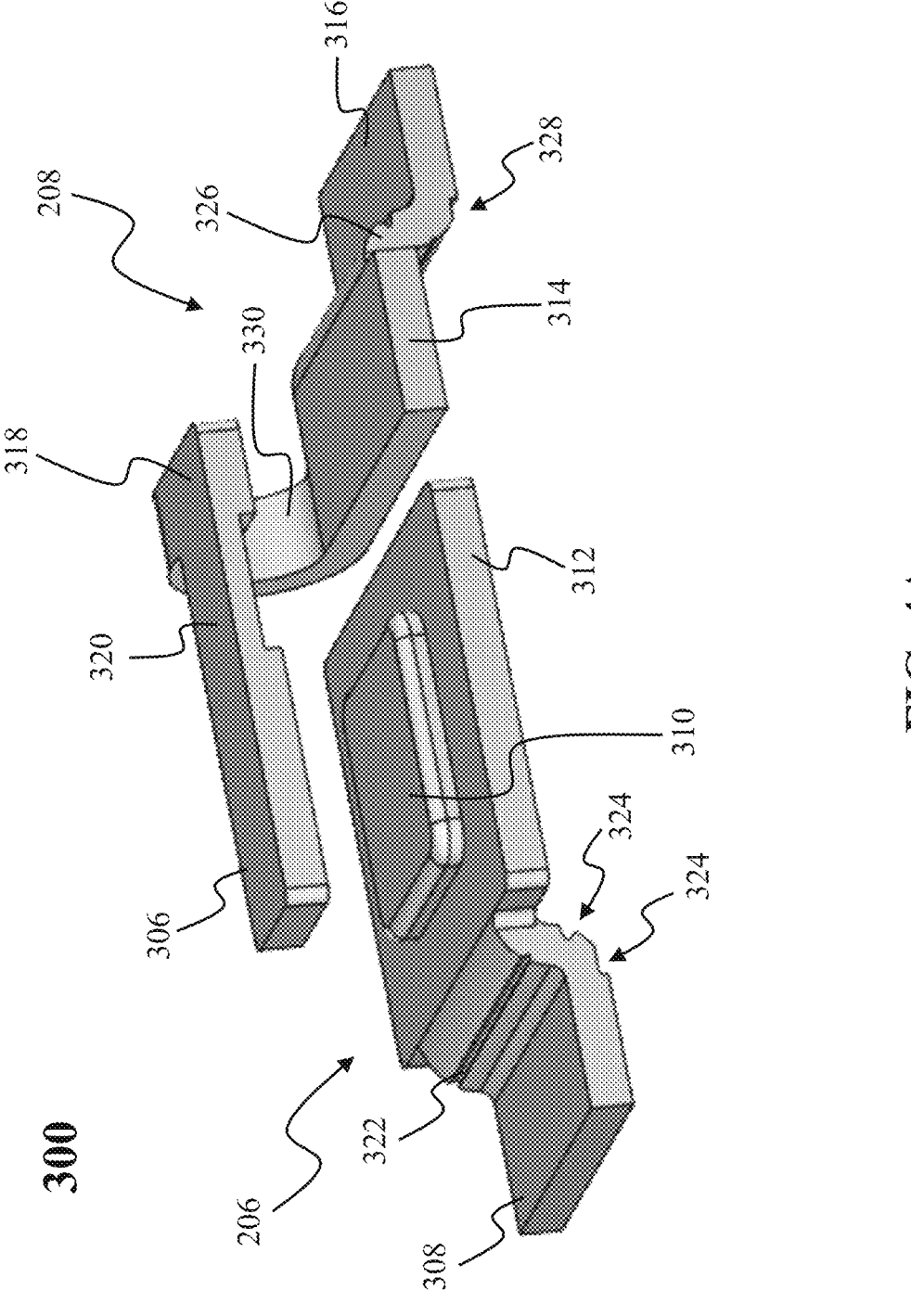
FIGS. 4A-4D are diagrams illustrating the integrated lead frame assembly of FIGS. 3A-3D, in accordance with exemplary embodiments.
Figure 4B:
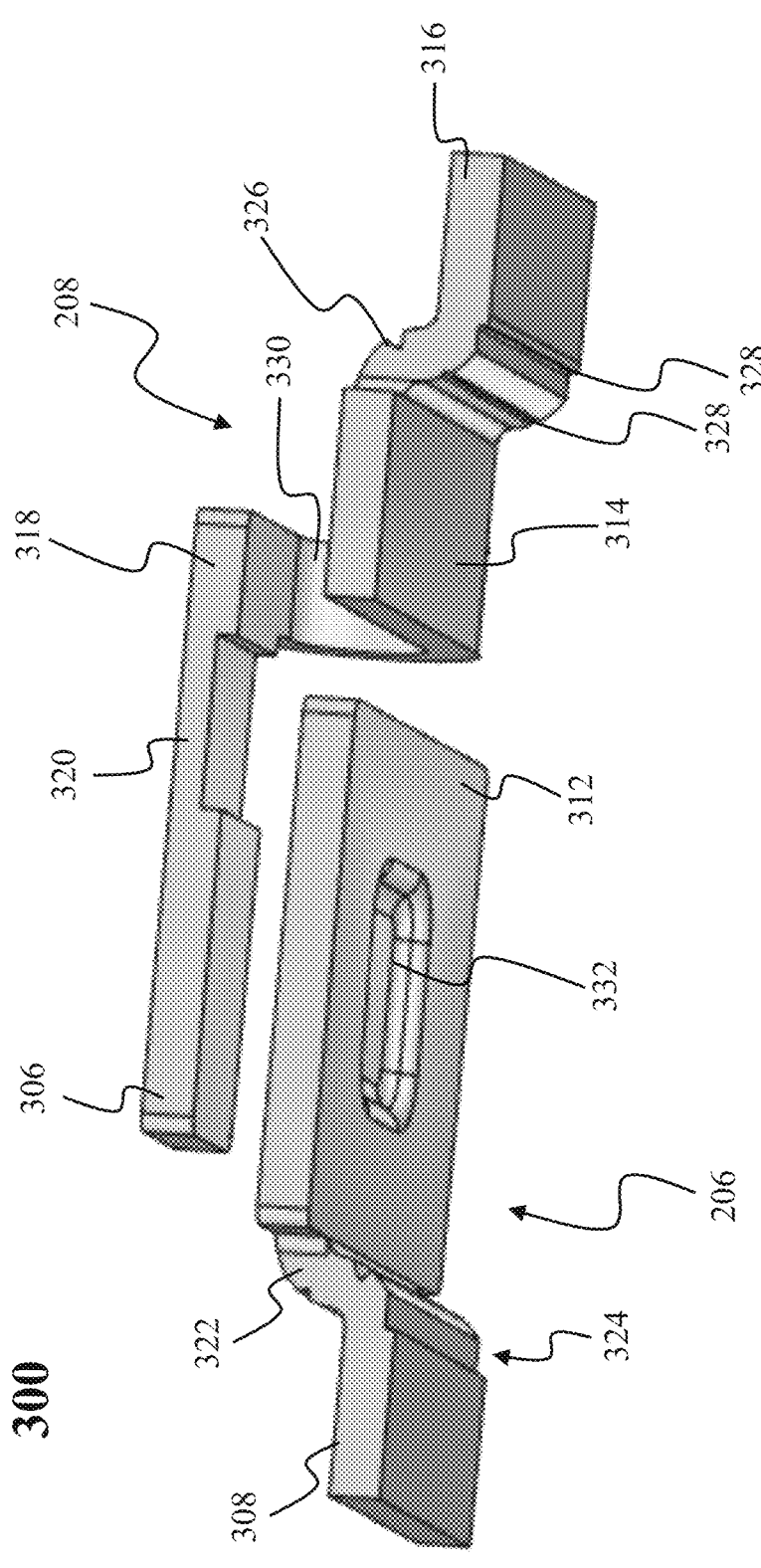
Figure 4C:
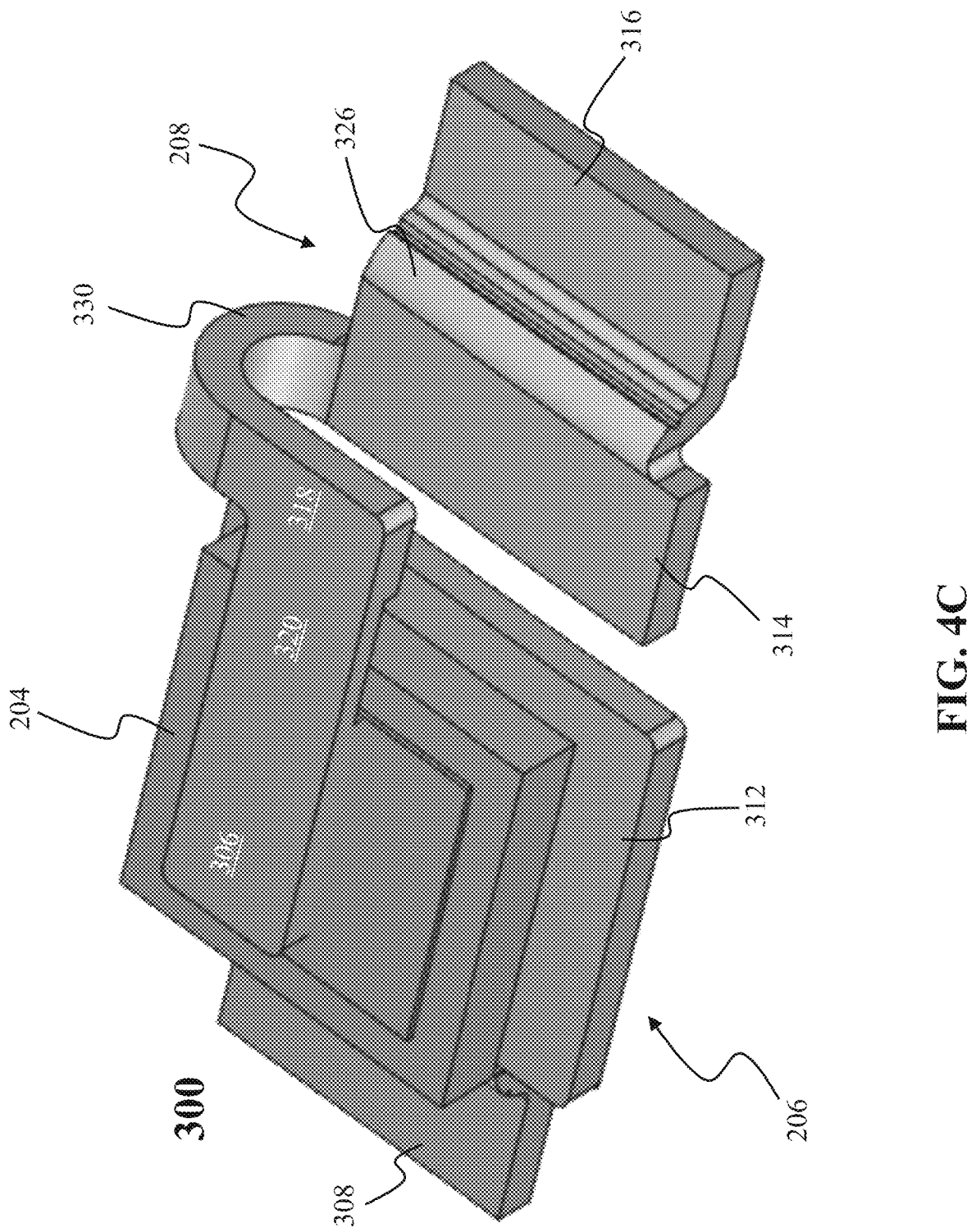
Figure 4D:
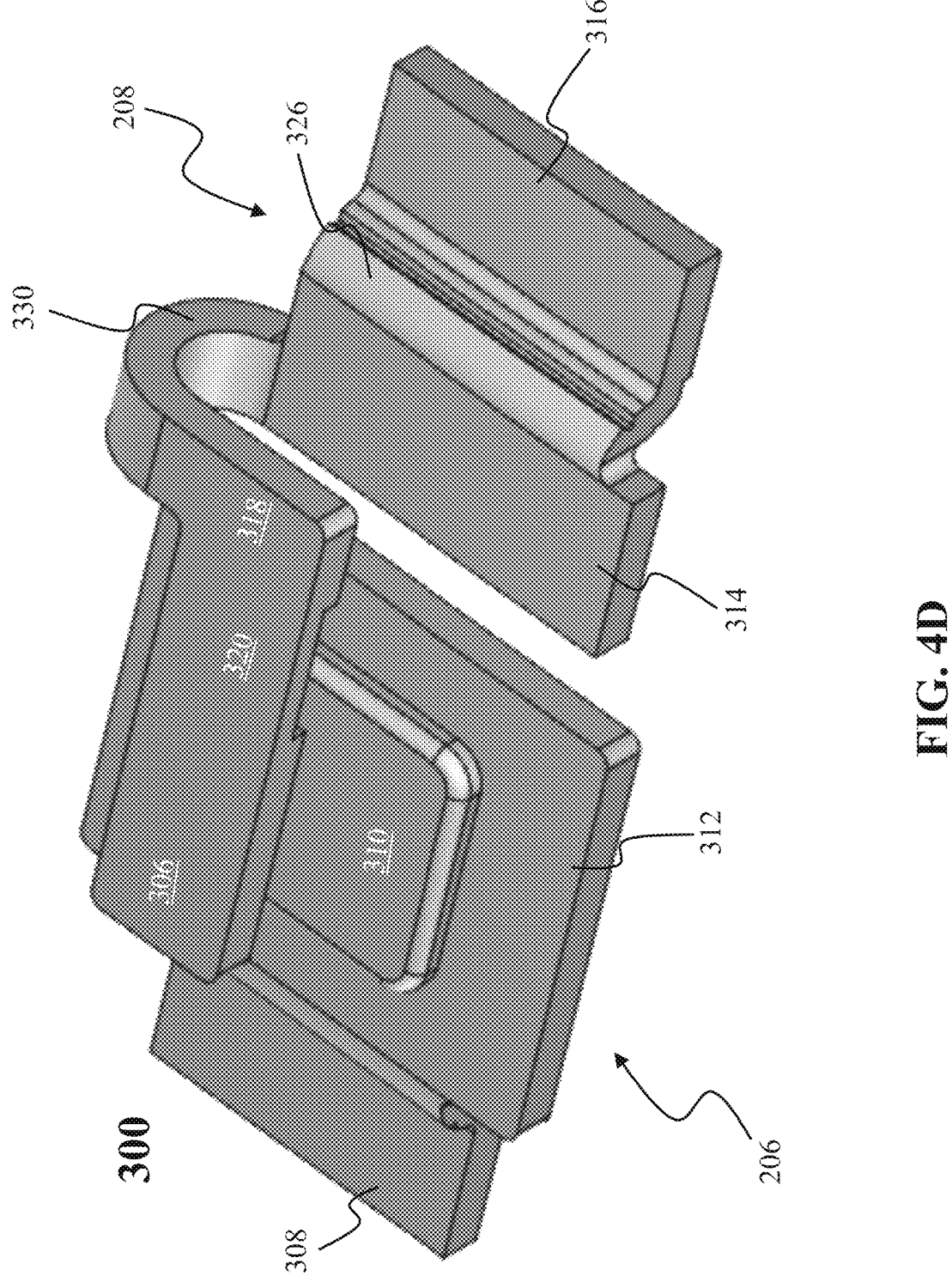

FIGS. 3A-3D and FIGS. 4A-4D are representative drawings of an integrated lead frame assembly 300 for use in the discrete semiconductor package 200 of FIG. 2, according to exemplary embodiments. FIGS. 3A-3D provide two-dimensional views while FIGS. 4A-4D are three-dimensional views. FIG. 3A is an exploded overhead view of the integrated lead frame assembly 300, FIG. 3B is a side view, FIG. 3C is an overhead view, and FIG. 3D is an exploded side view. FIG. 4A is a top exploded perspective view of the integrated lead frame assembly 300, FIG. 4B is a bottom exploded perspective view, FIG. 4C is a perspective view (which also shows the TVS chip 204), and FIG. 4D is a perspective view without the TVS chip.

The integrated lead frame assembly 300 consists of two parts already introduced in FIG. 2: the left lead 206 and the right lead 208. The left lead 206 and the right lead 208 make up the lead frame that connects the semiconductor (the TVS chip 204) to circuitry on circuit boards and electrical devices. As such, the left lead 206 and the right lead 208 are made of an electrically conductive material, such as copper or copper alloy.

The left lead 206 consists of a left lead terminal 308, a left lead pad 310, and a left lead platform 312. These three parts 308, 310, and 312 are formed as a single, unitary structure that may be cut from an electrically conductive material sheet such as copper or copper alloy. In exemplary embodiments, the left lead pad 310 is disposed on top of and centered over the left lead platform 312. On the underside of the left lead platform 312 is a cavity 332 (visible in FIGS. 3B, 3D, and 4B). In exemplary embodiments, the cavity 332 is formed as part of the lead manufacturing process.

Between the left lead terminal 308 and the left lead platform 312 are two features designed to release the bending stress in the assembly process: a left lead bend arm 322 and one or more left lead grooves 324 (visible in FIGS. 3B, 3D, 4A, and 4B). In exemplary embodiments, the left lead bend arm 322 is disposed on one surface of the left lead 206 and the one or more grooves 324 are disposed on a second, opposing surface of the left lead, yet still proximate the left lead bend arm. In exemplary embodiments, the left lead bend arm 322 and the left lead groove(s) 324 both support the TVS chip 204 and protect the chip from moisture, which increases the reliability of the discrete semiconductor package 200. In a non-limiting example, two left lead grooves 324 are shown (FIG. 4A). However, there may be more or fewer left lead grooves in the left lead 206 of the integrated lead frame assembly 300.

Figure 6B:
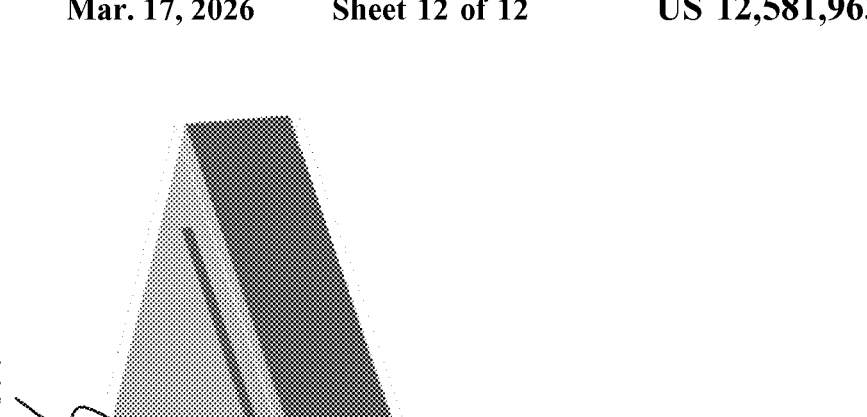
FIGS. 6A and 6B are diagrams illustrating the TVS chip used in the discrete semiconductor package of FIG. 2, in accordance with exemplary embodiments.
Figure 6A:
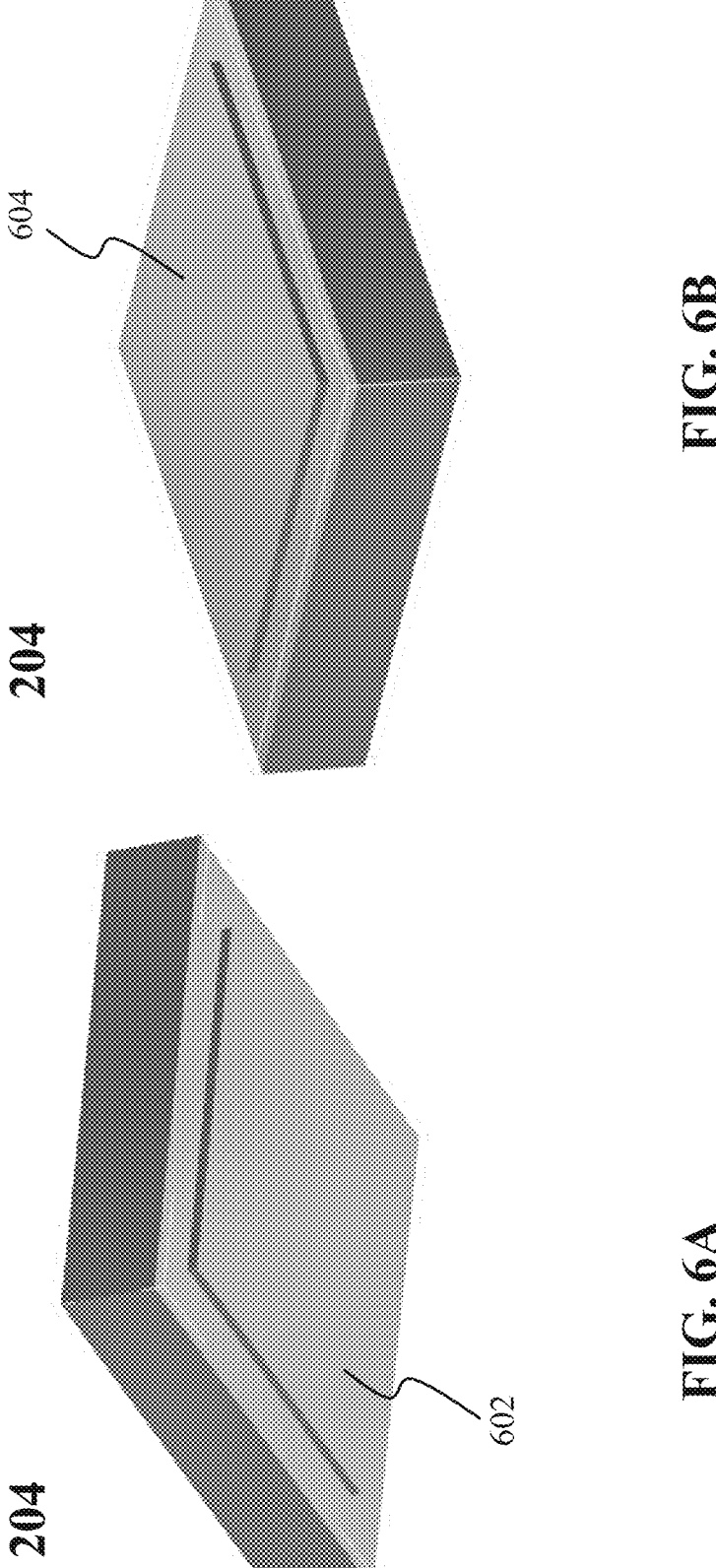

The left lead pad 310 is shaped to support the TVS chip 204. FIGS. 6A and 6B are representative drawings of the TVS chip 204 of the discrete semiconductor package 200 of FIG. 2, according to exemplary embodiments. The TVS chip 204 has a bottom platform 602 disposed on an underside of the TVS chip and a top platform 604 disposed on a topside of the TVS chip. In exemplary embodiments, the TVS chip 204 is placed on the left lead pad 310 such that the bottom platform 602 is disposed on the left lead pad. In exemplary embodiments, the area of the left lead pad 310 is slightly smaller than the area of the bottom platform 602. In exemplary embodiments, when the solder paste 214 is applied between the left lead 206 and the TVS chip 204, the bottom platform 602 will be affixed to the left lead pad 310.

In addition to the left lead 206, the integrated lead frame assembly 300 also includes the right lead 208. The right lead 208 features a right lead terminal 316, a right lead clip linker 314, a right lead clip arm 318, a right lead clip support 320, and clip coin 306. As with the left lead 206, the components of the right lead 208 are formed from a single, unitary structure that may be cut from an electrically conductive material sheet such as copper or copper alloy. In exemplary embodiments, the right lead terminal 316 is connected to the right lead clip linker 314, which is connected to the right lead clip arm 318, which is connected to the right lead clip support 320, which is connected to the clip coin 306.

Between the right lead terminal 316 and the right lead clip linker 314 are two features designed to release the bending stress in the assembly process: a right lead bend arm 326 and one or more right lead grooves 328 (visible in FIGS. 3B, 3D, 4A, and 4B). In exemplary embodiments, the right lead bend arm 326 is disposed on one surface of the right lead 208 and the one or more grooves 328 are disposed on a second, opposing surface of the right lead, yet still proximate the right lead bend arm. In exemplary embodiments, the right lead bend arm 326 and the right lead groove(s) 328 release the bending stress during the assembly process of the discrete semiconductor package 200. In a non-limiting example, two right lead grooves 328 are shown (FIG. 4B). However, there may be more or fewer right lead grooves in the right lead 208 of the integrated lead frame assembly 300.

The clip coin 306 is shaped to support the TVS chip 204. In exemplary embodiments, the clip coin 306 is placed over the TVS chip 204 on the top platform 604 (FIG. 6B). In exemplary embodiments, the area of the clip coin 306 is slightly smaller than the area of the top platform 604. In exemplary embodiments, when the solder paste 212 is applied between the clip coin 306 and the TVS chip 204, the top platform 604 will be affixed to the clip coin 306.

The right lead clip support 320, which is adjacent the clip coin 306 and between the clip coin and the right lead clip arm 318, is slightly thinner than either the clip coin or the right lead clip arm. In exemplary embodiments, the decrease in the size and weight of the right lead clip support 320 enables more solder paste to be absorbed during affixation of the right lead 208 to the TVS chip 204 and provides a conduit between the clip coin 306 and the right lead clip arm.

In exemplary embodiments, disposed between the right lead clip arm 318 and the right lead clip linker 314 is a bending shape 330. The bending shape 330 is sized so that the clip coin 306 will be positioned above the TVS chip 204 but will still be attachable to the TVS chip by adding solder paste to the top surface of the TVS chip. In exemplary embodiments, the bending shape 330 links the clip coin 306 to the right lead terminal 316 (produces a downward force of the clip coin 306), and links to the top platform 604 of the TVS chip 204.

In exemplary embodiments, the right lead clip linker 314 of the right lead 208 is disposed in the same plane as the left lead platform of the left lead 206. Similarly, in exemplary embodiments, the left lead terminal 308 of the left lead 206 is disposed in the same plane as the right lead terminal 316 of the right lead 208.

Figure 5:
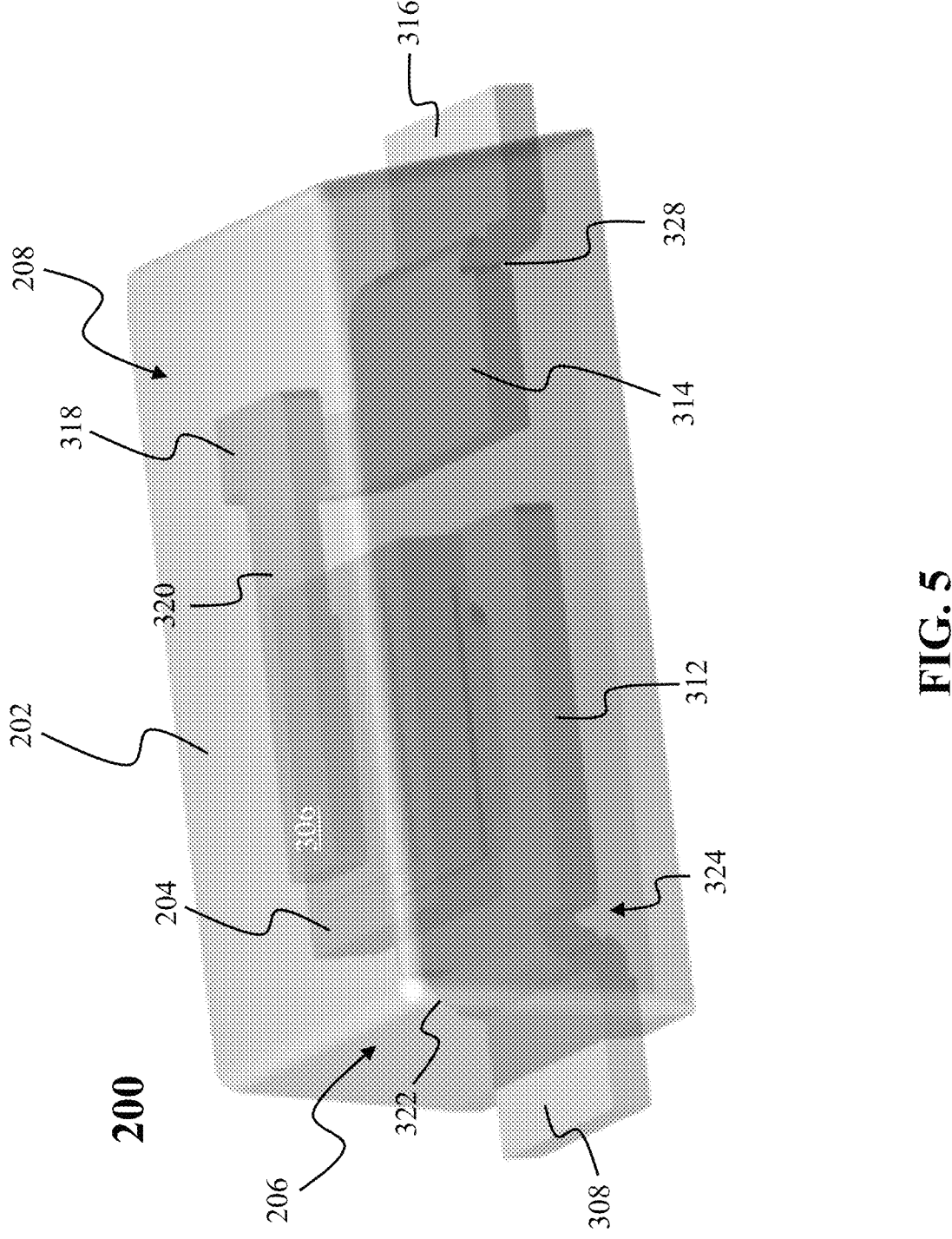
FIG. 5 is a diagram illustrating the discrete semiconductor package of FIG. 2, in accordance with exemplary embodiments.

FIG. 5 is a representative drawing of the discrete semiconductor package 200, according to exemplary embodiments. The compound 202 is transparent to enable viewing of the integrated lead frame assembly 300 therein. The TVS chip 204 is also shown. By integrating the clip function with the right lead 208, the discrete semiconductor package 200 can be assembled with three parts: the left lead 206, the TVS chip 204, and the right lead 208. In exemplary embodiments, the discrete semiconductor package 200 can be assembled with an improved yield over the prior art discrete semiconductor package 100.

Although the discrete semiconductor package 200 is a SOD123FL semiconductor package and the semiconductor is a TVS diode, the principles shown and described herein can be applied to a different type of semiconductor package with a different discrete semiconductor, as the inventive concepts may be applied to several different types of semiconductor packages and semiconductor devices.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A discrete semiconductor package comprising:
a semiconductor device;
a left lead comprising a left terminal and a platform to support the semiconductor device on a first side; and
a right lead comprising a right terminal and a clip coin, the clip coin to support the semiconductor device on a second side, wherein the second side is opposite the first side,
wherein the right lead further comprises a bend disposed between the right terminal and the clip coin, the bend configured to exert a downward force on the semiconductor device and protect the semiconductor device from moisture.

2. The discrete semiconductor package of claim 1, the left lead further comprising a pad disposed between the platform and the first side.

3. The discrete semiconductor package of claim 2, wherein the first side of the semiconductor device is soldered to the pad.

4. The discrete semiconductor package of claim 1, wherein the second side of the semiconductor device is soldered to the clip coin.

5. The discrete semiconductor package of claim 1, the right lead further comprising a clip linker, a clip arm, and a clip support, wherein the right terminal is coupled to the clip linker, the clip linker is coupled to the clip arm, the clip arm is coupled to the clip support, and the clip support is coupled to the clip coin.

6. The discrete semiconductor package of claim 1, the right lead further comprising one or more grooves disposed between the right terminal and the clip linker, wherein the one or more grooves support the semiconductor device and protect the semiconductor device from moisture.

7. The discrete semiconductor package of claim 6, wherein the bend is disposed opposite the one or more grooves.

8. The discrete semiconductor package of claim 2, the left lead further comprising a bend disposed between the left terminal and the platform, wherein the bend supports the semiconductor device and protects the semiconductor device from moisture.

9. The discrete semiconductor package of claim 8, further comprising one or more grooves disposed between the left terminal and the platform, wherein the one or more grooves support the semiconductor device and protect the semiconductor device from moisture.

10. The discrete semiconductor package of claim 9, wherein the bend is disposed opposite the one or more grooves.

11. The discrete semiconductor package of claim 5, the right lead further comprising a bending shape disposed between the clip linker and the clip arm, wherein the bending shape produces a downward force of the clip coin toward the second side of the semiconductor device.

12. The discrete semiconductor package of claim 5, wherein the platform is planar with the clip linker.

13. The discrete semiconductor package of claim 5, wherein the left terminal is planar with the right terminal.

14. An integrated lead frame assembly to connect to a semiconductor inside a discrete semiconductor package, the integrated lead frame assembly comprising:

a left lead comprising a left terminal and a platform to support the semiconductor on a first side; and a right lead comprising a right terminal and a clip coin, the clip coin to support the semiconductor on a second side, wherein the second side is opposite the first side, wherein the right lead further comprises a bend disposed between the right terminal and the clip coin, the bend configured to exert a downward force on the semiconductor and protect the semiconductor from moisture.

15. The integrated lead frame assembly of claim 14, the left lead further comprising a pad disposed between the platform and the first side, wherein the first side of the semiconductor is soldered to the pad.

16. The integrated lead frame assembly of claim 14, the right lead further comprising a clip linker, a clip arm, and a clip support, wherein the right terminal is coupled to the clip linker, the clip linker is coupled to the clip arm, the clip arm is coupled to the clip support, and the clip support is coupled to the clip coin, wherein the second side of the semiconductor is soldered to the clip coin.

17. The integrated lead frame assembly of claim 16, the right lead further comprising:

one or more grooves disposed between the right terminal and the clip linker; wherein the bend and the one or more grooves supports the semiconductor and protects the semiconductor from moisture.

18. The integrated lead frame assembly of claim 14, the left lead further comprising:

a bend disposed between the left terminal and the platform; and one or more grooves disposed between the left terminal and the platform;

wherein the bend and the one or more grooves support the semiconductor and protect the semiconductor from moisture.

19. The integrated lead frame assembly of claim 17, the right lead further comprising a bending shape disposed between the clip linker and the clip arm, wherein the bending shape produces a downward force of the clip coin toward the second side of the semiconductor.

* * * * *